United States Patent [19]
Bothra et al.

[11] Patent Number: 5,928,968
[45] Date of Patent: Jul. 27, 1999

[54] SEMICONDUCTOR PRESSURE TRANSDUCER STRUCTURES AND METHODS FOR MAKING THE SAME

[75] Inventors: Subhas Bothra, San Jose; Harlan Lee Sur, Jr., San Leandro, both of Calif.

[73] Assignee: VLSI Technology, Inc., San Jose, Calif.

[21] Appl. No.: 08/995,500

[22] Filed: Dec. 22, 1997

[51] Int. Cl.$^6$ .................................................. H01L 21/00
[52] U.S. Cl. .......................... 438/745; 438/53; 438/745; 438/754
[58] Field of Search .................................. 438/745, 754, 438/52, 53

[56] References Cited

U.S. PATENT DOCUMENTS

| | | | |
|---|---|---|---|
| 4,665,610 | 5/1987 | Barth | 29/580 |
| 4,906,586 | 3/1990 | Blackburn | 437/40 |
| 5,244,534 | 9/1993 | Yu et al. | 438/692 |
| 5,723,382 | 3/1998 | Sandhu et al. | 438/653 |
| 5,793,105 | 8/1998 | Pace | 257/700 |
| 5,808,210 | 9/1998 | Herb et al. | 73/862.59 |

OTHER PUBLICATIONS

S.T. Cho, K. Najafi, C.L. Lowman and K.D. Wise, "An Ultrasensitive Silicon Pressure–Based Flowmeter", 1989 IEEE, Center for Integrated Sensors and Circuits, Dept. of Electrical Engineering and Computer Science, University of Michigan, Ann Arbor, MI.

*Primary Examiner*—Benjamin Utech
*Assistant Examiner*—Kin-Chan Chen
*Attorney, Agent, or Firm*—Martine Penilla & Kim, LLP

[57] ABSTRACT

Disclosed is a method for making a semiconductor pressure transducer structure in CMOS integrated circuits. The method includes patterning a first metallization layer that lies over an first oxide layer to produce a first patterned metallization layer that is not in electrical contact with a substrate. Forming a tungsten plug in a second oxide layer that overlies the first patterned metallization layer, such that the tungsten plug is in electrical contact with the first patterned metallization layer. Patterning a second metallization layer that overlies the first patterned metallization layer and the tungsten plug to produce a second patterned metallization layer. The patterning of the second metallization layer is configured to prevent the second patterned metallization layer from completely overlying the tungsten plug. The method further includes submerging the pressure transducer structure in a basic solution having a pH level that is greater than about 7. In this manner, the tungsten plug will come in direct contact with the basic solution that causes the tungsten plug to be removed while the pressure transducer structure is submerged in the basic solution.

9 Claims, 5 Drawing Sheets

SEMICONDUCTOR PRESSURE TRANSDUCER STRUCTURES AND METHODS FOR MAKING THE SAME

CROSS REFERENCE TO RELATED APPLICATIONS

This application is related to the following US patent application having Ser. No. 08/995,650 pending (attorney docket no. VTI1P180), filed on the same day as the instant application, and entitled "Programmable Semiconductor Structures and Methods for Making the Same." This application is hereby incorporated by reference.

BACKGROUND OF THE INVENTION

1. Field of the Invention

The present invention relates generally to integrated circuits and, more particularly, to pressure transducer structures and efficient methods for fabricating the same.

2. Description of the Related Art

Pressure transducers are devices that are typically fabricated into semiconductor devices to sense external pressure conditions. In some applications, pressure transducers are coupled to integrated control circuitry that may be triggered to perform an operation in response to the sensed external pressures.

For ease of understanding, FIG. 1A shows a cross-sectional view of a pressure transducer structure 100. The pressure transducer structure 100 is fabricated over a substrate 102. The substrate 102 has an inter-metal oxide 104 formed thereon, and a patterned metallization layer 108 formed over the inter-metal oxide 104. An inter-metal oxide 106 is then formed over the patterned metallization layer 108 and portions of the inter-metal oxide layer 104. During the fabrication process, a hole 114 is etched into the inter-metal oxide layer 106 to define a cavity having a bottom surface that is the patterned metallization layer 108.

Once the hole 114 is defined, a sacrificial oxide material is deposited into the hole 114 before a patterned metallization layer 110 is formed over the inter-metal oxide layer 106. Conventionally, the sacrificial oxide material is deposited into the hole 114 to provide mechanical support for the subsequently formed patterned metallization layer 110. However, the sacrificial oxide material must be removed from the hole 114 before an oxide layer 112 is deposited over the inter-metal oxide layer 106 and the patterned metallization layer 110.

As shown in FIG. 1B, a portion of the hole 114 is left exposed once the patterned metallization layer 110 is formed over the inter-metal oxide layer 106 to enable a wet etch chemical to come into contact with the sacrificial oxide (i.e., that is contained in the hole 114). Once all of the sacrificial oxide is removed from the hole 114, the oxide layer 112 is deposited over the inter-metal oxide layer 106 and the patterned metallization layer 110. At this point, the pressure transducer structure 100 is complete, and a voltage may be measured between the patterned metallization layer 108 and the patterned metallization layer 110 to determine an external pressure.

In this example, a pressure $P_1$ is shown applied to the oxide layer 112 that lies over the hole 114. In pressure transducers, the pressure $P_1$ may be determined by measuring the capacitance $C_1$ detected between the patterned metallization layers 108 and 110. When the pressure increases by $\Delta P$ as shown in FIG. 1C, the patterned metallization layer 110 and the oxide layer 112 will compress into the hole 114. When this happens, the capacitance $C_1$ of FIG. 1A will change to a capacitance $C_2$, which is measured between the patterned metallization layers 108 and 110. By measuring the new capacitance value, it is possible to accurately determine the new increased external pressure.

Although these conventional pressure transducer structures 100 find many practical applications in devices, such as, altitude sensors, flow meters, accelerometers for deploying airbags in automobiles, and other useful applications, they unfortunately add substantial manufacturing complexities to standard CMOS circuitry manufacturing.

Thus, in order to manufacture conventional pressure transducers, an additional level of manufacturing must be completed after the interconnecting contact structures are formed. For example, once the interconnecting structures are formed, an additional application of photoresist must be applied and patterned to define the location of the hole for the pressure transducer. Once the photoresist mask is formed, the pressure transducer hole is etched and filled with the sacrificial oxide. Next, the excess sacrificial oxide may be removed with a chemical mechanical polishing operation before the patterned metallization layer 110 is applied. Next, the sacrificial oxide is removed with the wet etching process before the oxide layer 112 is applied. As can be appreciated, the process of integrating pressure transducers into standard CMOS circuitry manufacturing is a task that increases complexity and adds a substantial amount of cost to CMOS fabrication operations.

In view of the foregoing, there is a need for a method and apparatus for manufacturing integrated circuit devices that include pressure transducer structures, without increasing manufacturing complexity.

SUMMARY OF THE INVENTION

Broadly speaking, the present invention fills these needs by providing a pressure transducer structure that may be efficiently made using standard CMOS manufacturing operations that avoid introducing added manufacturing complexities and increased costs. It should be appreciated that the present invention can be implemented in numerous ways, including as a process, an apparatus, a system, a device, or a method. Several inventive embodiments of the present invention are described below.

In one embodiment, a method for making a semiconductor pressure transducer structure is disclosed. The method includes patterning a first metallization layer that lies over an first oxide layer to produce a first patterned metallization layer that is not in electrical contact with a substrate. Forming a tungsten plug in a second oxide layer that overlies the first patterned metallization layer, such that the tungsten plug is in electrical contact with the first patterned metallization layer. Patterning a second metallization layer that overlies the first patterned metallization layer and the tungsten plug to produce a second patterned metallization layer. The patterning of the second metallization layer is configured to prevent the second patterned metallization layer from completely overlying the tungsten plug. The method further includes submerging the pressure transducer structure in a basic solution having a pH level that is about greater than 7. In this manner, the tungsten plug will come in direct contact with the basic solution that causes the tungsten plug to be removed while the pressure transducer structure is submerged in the basic solution.

In another embodiment, a system for making an air capacitive hole for a pressure transducer structure is disclosed. The air capacitive hole lies between a bottom metallization feature and a top metallization feature. The system for making the air capacitive hole includes plasma etching a bottom metallization layer to form the bottom metallization feature that is not in electrical contact with a substrate. Forming a dielectric layer over the bottom metallization feature. The dielectric layer having a tungsten plug that is in contact with the bottom metallization feature. Plasma etching a top metallization layer to form the top metallization feature that substantially overlies the tungsten plug, but leaves an opening down to the tungsten plug. The system further includes submerging the pressure transducer structure in a basic solution. In this manner, the tungsten plug will come in direct contact with the basic solution that causes the tungsten plug to erode and define the air capacitive hole while the pressure transducer structure is submerged in the basic solution.

In yet another embodiment, an apparatus for making an air capacitive hole used in a semiconductor pressure transducer structure is disclosed. The air capacitive hole lies between a bottom metallization feature and a top metallization feature. The apparatus for making the air capacitive hole includes means for plasma etching a bottom metallization layer to form the bottom metallization feature that is not in electrical contact with a substrate. Means for forming a dielectric layer over the bottom metallization feature. The dielectric layer having a tungsten plug that is in contact with the bottom metallization feature. Means for plasma etching a top metallization layer to form the top metallization feature that substantially overlies the tungsten plug, but leaves an opening down to the tungsten plug. The apparatus further includes means for submerging the pressure transducer structure in a basic solution, such that the tungsten plug comes in direct contact with the basic solution. The basic solution therefore causes the tungsten plug to erode and define the air capacitive hole while the pressure transducer structure is submerged in the basic solution.

One advantage of the present invention is that pressure transducer structures may be manufactured using standard CMOS processing operations. As can be appreciated, this eliminates the need for additional process steps of using sacrificial oxide to form pressure transducers, which will necessarily increase cost and slow down fabrication cycles. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a pressure transducer structure that may be efficiently made using standard CMOS manufacturing operations that avoid introducing added manufacturing complexities and increased costs is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
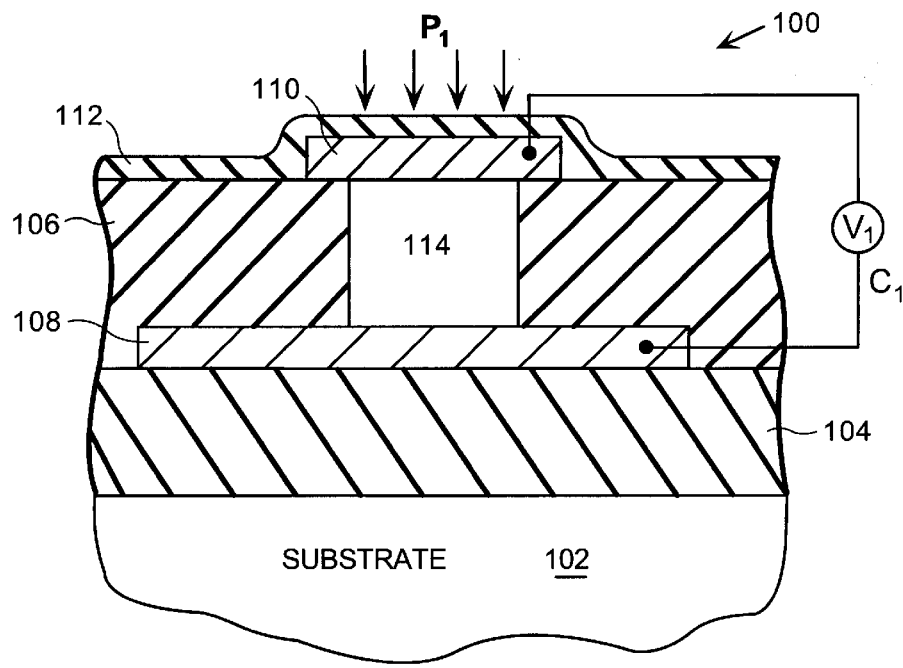
FIGS. 1A, 1B, 1C show views of a semiconductor pressure transducer structure.
Figure 1B:
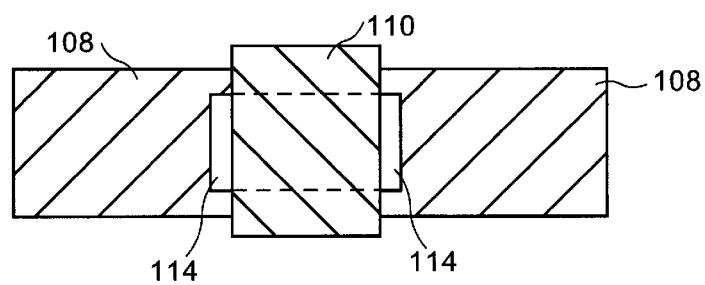
Figure 1C:
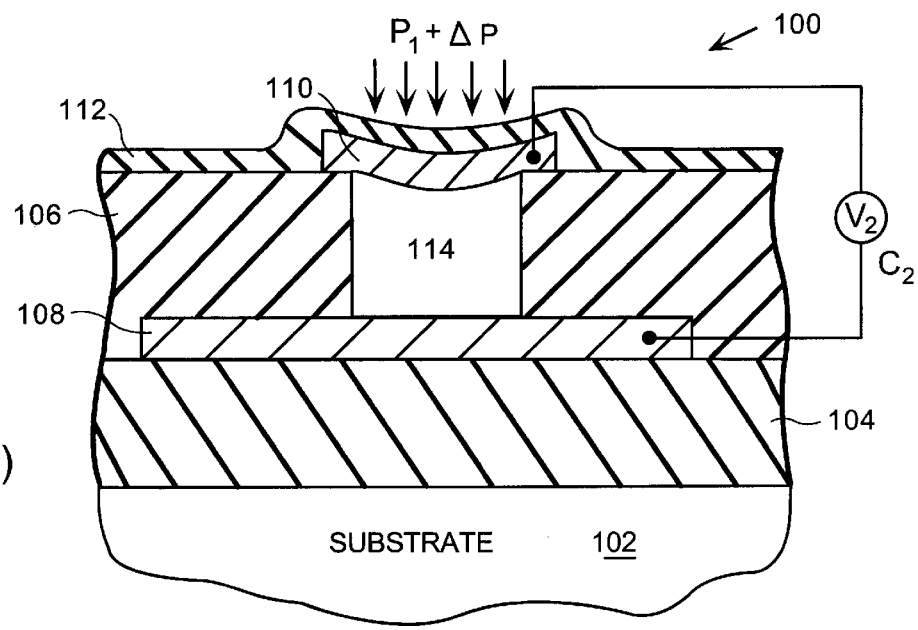
Figure 2:
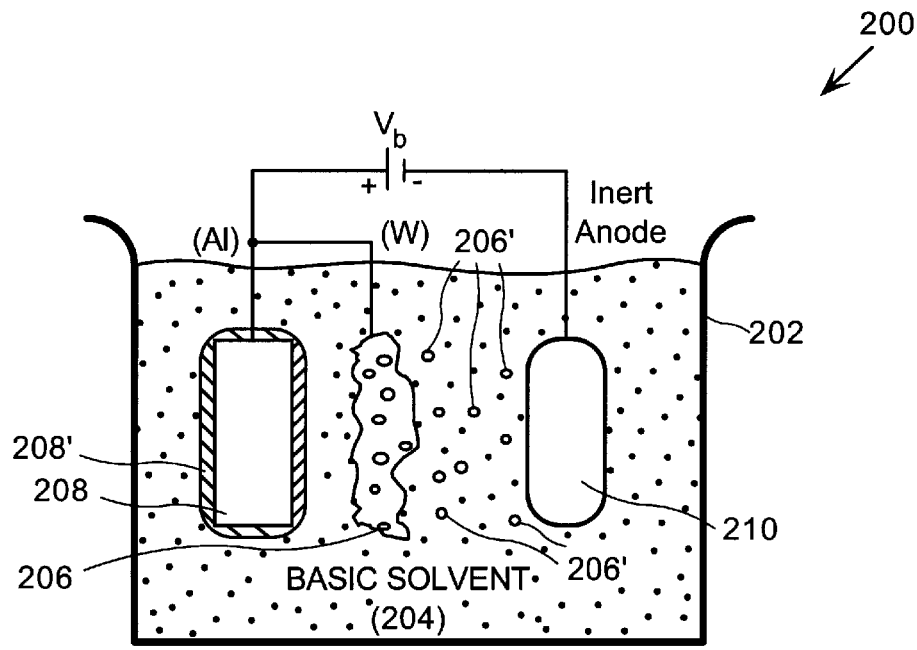
FIG. 2 shows a chemical reaction system having an aluminum electrode and a tungsten electrode submerged in a basic solution in accordance with one embodiment of the present invention.

FIG. 2 shows a chemical reaction system 200 having an aluminum electrode 208 and a tungsten electrode 206 submerged in a basic solution 204 in accordance with one embodiment of the present invention. In this example, both the aluminum electrode 208 and the tungsten electrode 206 are coupled to a positive bias voltage $V_b$, and a negative electrode 210 is coupled to a negative terminal of the bias voltage $V_b$. The basic solvent 204 is preferably an electrolyte that preferably has a pH level that is greater than 7, and more preferably is greater than about 8, and most preferably is greater than about 10.

Although a chemical reaction between the aluminum electrode 208 and the basic solvent 204, and the tungsten electrode 206 and the basic solvent 204 will naturally occur without the application of a bias voltage $V_b$, the chemical reaction in the basic solvent 204 may be accelerated by applying the bias voltage $V_b$. For example, when the bias voltage $V_b$ is applied between the two electrodes, the tungsten electrode 206 will rapidly begin to erode by reacting with the basic solvent 204. This reaction produces tungsten oxide $WO_3$ 206' which rapidly dissolves in lightly basic solutions. Once the reaction begins, the tungsten will continue to oxidize until the tungsten electrode 206 is completely eroded.

In contrast however, the aluminum electrode 208 will not erode in the basic solvent 204, but will form an aluminum oxide passivation layer 208'. Because standard CMOS circuit fabrication processes utilize aluminum interconnect lines, and tungsten plugs to interconnect the aluminum lines of the various levels, it is possible to simultaneously manufacture a pressure transducer during the standard CMOS circuit fabrication process.

By way of example, when an interconnect layer is designed, a pressure transducer may be simultaneously designed into that layer by allowing a portion of a tungsten plug to be exposed, before the semiconductor structure (i.e., the wafer) is submerged into a basic solvent that is commonly used to remove polymers after a metallization etching operation. An embodiment of this technique will now be described in greater detail with reference to FIGS. 3A through 3F.

Figure 3A:
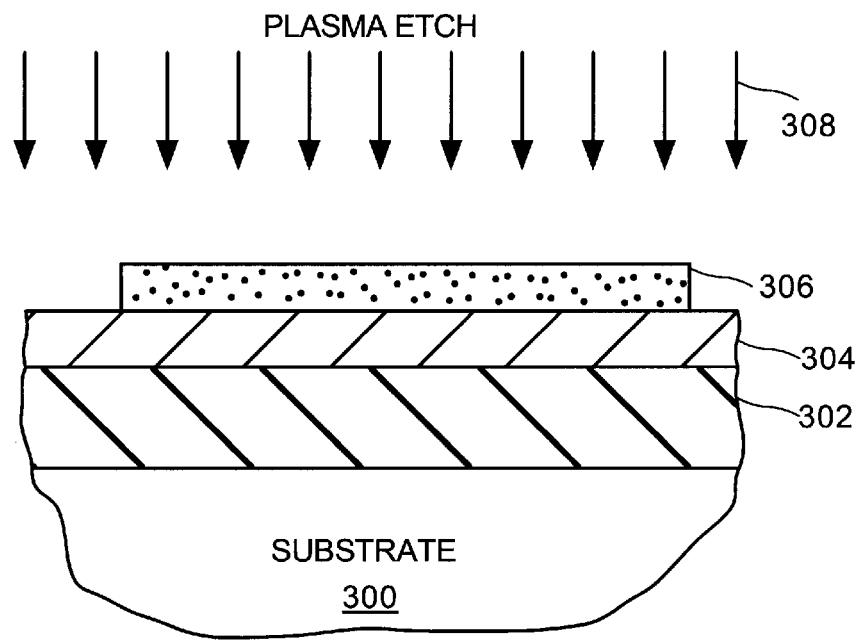
FIG. 3A shows a cross-sectional view of a partially fabricated semiconductor structure that is formed over a substrate in accordance with one embodiment of the present invention.

FIG. 3A shows a cross-sectional view of a partially fabricated semiconductor structure that is formed over a substrate 300 in accordance with one embodiment of the present invention. In an initial operation, an inter-metal oxide 302 is formed over the substrate 300, and then a metallization layer 304 is sputtered over the inter-metal oxide layer 302. In order to pattern the metallization layer 304, a photoresist mask 306 is formed over the metallization layer 304. As is well known, the photoresist mask 306 may be patterned using any number of well known techniques, including conventional photolithography.

Once the photoresist mask 306 has been formed, a plasma etching operation 308 is performed to remove the metallization layer 304 that is not covered by the photoresist mask 306. Although any plasma etcher may be used, one exemplary plasma etcher is a Lam Research TCP 9600 SE etcher, that is available from Lam Research of Fremont, Calif. In this embodiment, the plasma etcher is configured to negatively charge the substrate 300 to a negative potential, and the metallization layers that are not electrically connected to the substrate 300 (i.e., through conductive via structures) to a positive potential.

Figure 3B:
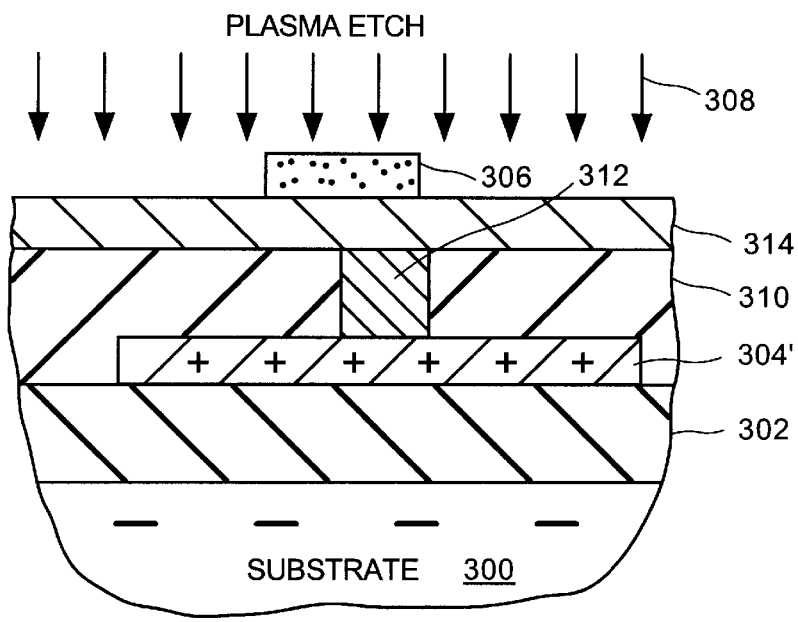
FIG. 3B shows a cross-sectional view of the semiconductor structure of FIG. 3A after a number of layers are fabricated over an inter-metal oxide layer and a patterned metallization layer in accordance with one embodiment of the present invention.

FIG. 3B shows a cross-sectional view of the semiconductor structure of FIG. 3A after a number of layers are fabricated over the inter-metal oxide layer 302 and a patterned metallization layer 304' in accordance with one embodiment of the present invention. As pictorially shown, the patterned metallization layer 304' was charged to a positive (+) potential, and is a floating structure that is not connected to a diffusion or gate of the substrate 300. In this example, an inter-metal oxide layer 310 was formed over the patterned metallization layer 304', and a tungsten plug 312 was formed within a via that was etched into the inter-metal oxide layer 310.

After the tungsten plug 312 is formed into the inter-metal oxide layer 310, a metallization layer 314 is sputtered over the inter-metal oxide layer 310 and the tungsten plug 312. In order to pattern the metallization layer 314, a photoresist mask 306 is patterned over the metallization layer 314. In this embodiment, the photoresist mask 306 is patterned such that at least a portion of the tungsten plug 312 is exposed once the metallization layer 314 is etched. Therefore, once the plasma etch operation 308 is performed, the structure of FIG. 3C will result. As shown, a patterned metallization layer 314' will now lie over the inter-metal oxide layer 310, and over substantially all of the tungsten plug 312. However, at least one gap 320 of any suitable shape will expose a portion of the underlying tungsten plug 312. After the etching operations are complete, a charge "Q" that is equivalent to the capacitance "C" of the patterned metallization layers 304' and 314' multiplied by the induced plasma voltage during the plasma etching of the metal (i.e., Q=C*V).

Figure 3C:
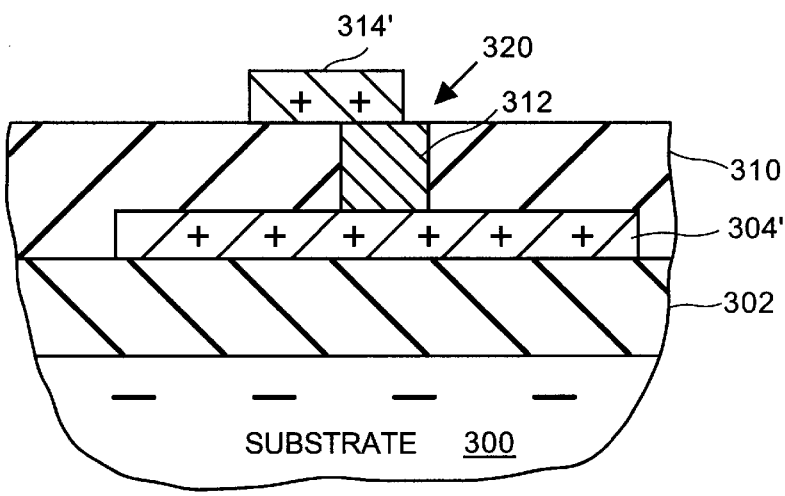
FIG. 3C shows the cross-sectional view of FIG. 3B after a top metallization layer is etched in a plasma etcher in accordance with one embodiment of the present invention.
Figure 3D:
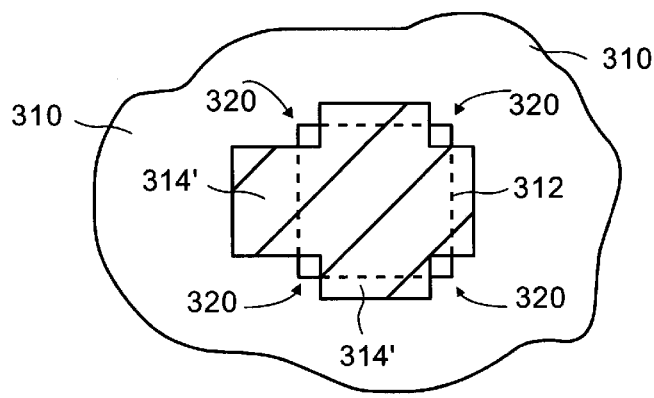
FIG. 3D shows a top view of the structure of FIG. 3C in accordance with one embodiment of the present invention.

FIG. 3D shows a top view of the structure of FIG. 3C in accordance with one embodiment of the present invention. As shown, the patterned metallization layer 314' is patterned such that at least one gap 320 exposes the underlying tungsten plug 312 material. As mentioned above, it is important that at least a portion of the tungsten plug 312 is accessible to a basic solvent 204, which will advantageously cause the tungsten material of the tungsten plug 312 to erode out of the via hole.

Figure 3E:
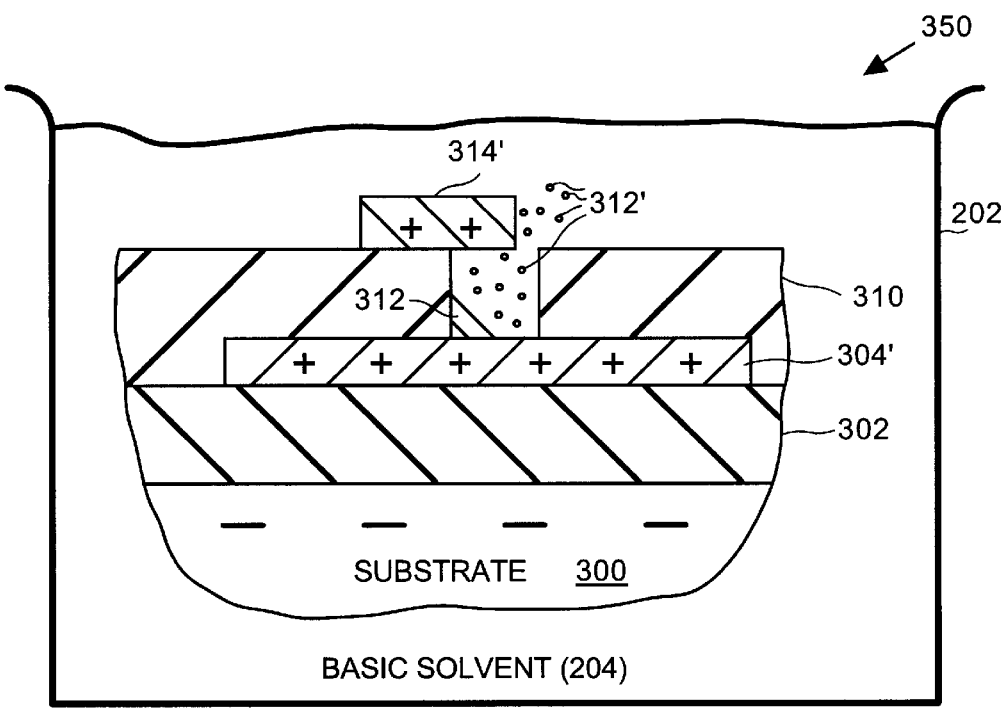
FIG. 3E shows a polymer removal system in which a fabricated substrate is submerged in a basic solvent in accordance with one embodiment of the present invention.

FIG. 3E shows a polymer removal system 350, in which a fabricated substrate 300 is submerged in a basic solvent 204 in accordance with one embodiment of the present invention. Because the fabricated substrate 300 is usually submerged in a container 202 that contains the basic solvent 204 during standard CMOS polymer removal operations, it is advantageously possible to simultaneously fabricate pressure transducers during these operations. That is, the polymer removal system 350 is generally used as a standard operation after a plasma operation, and therefore, by strategically patterning metallization materials over selected tungsten plugs, it will be possible to densely integrate pressure transducers in densely integrated CMOS circuits.

Therefore, by ensuring that pressure transducer level is not connected to the negatively charged substrate 300 when a pressure transducer is fabricated (e.g., through a conductive via), and by pattering the overlying metallization to ensure that a gap exposes a tungsten plug to a basic solvent having a pH level that is greater than 7, it is possible to efficiently fabricate the pressure transducer structure.

In this example, because the patterned metallization layer 314' and the patterned metallization layer 304' are not in electrical contact with the substrate 300 that is negatively charged, the chemical reaction described with reference to FIG. 2 will naturally occur. That is, the tungsten plug material 312 will immediately begin to erode and be converted to tungsten oxide ions 312'. As a result, the tungsten plug material 312 will be completely removed, thereby creating a clean via hole that may be used to form the pressure transducer structure. In one embodiment, the erosion of the tungsten material will generally occur so long as the charge Q of the metal capacitor divided by $1.6 \times 10^{-19}$ is greater than the number of tungsten atoms in the via plug (i.e., $Q/1.6 \times 10^{-19} > W$ atoms in plug).

Figure 3F:
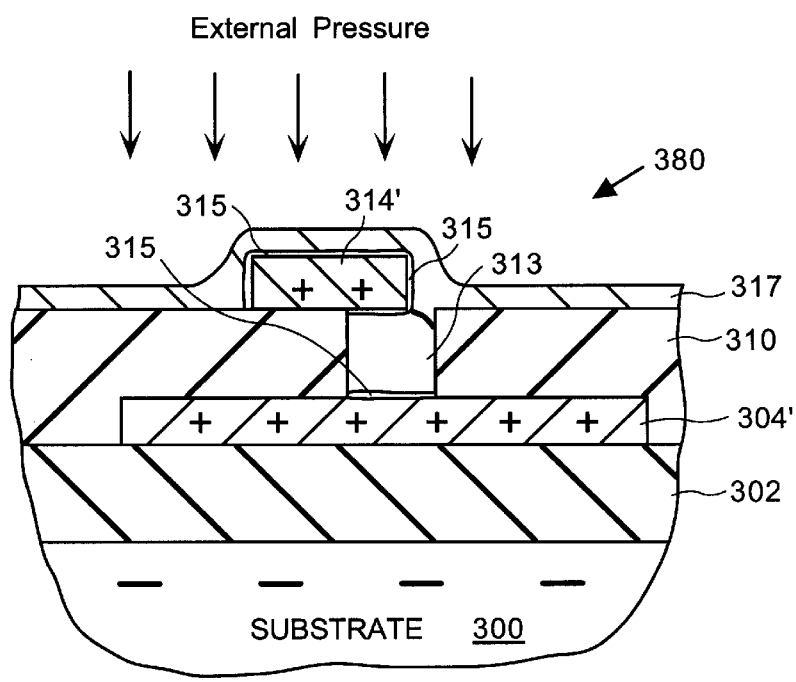
FIG. 3F shows a cross-sectional view of a pressure transducer in accordance with one embodiment of the present invention.

FIG. 3F shows a cross-sectional view of a pressure transducer 380 in accordance with one embodiment of the present invention. During the submersion into the basic solvent 204, the entire tungsten plug 312 was removed, thereby leaving a via hole 313. However, the exposed patterned metallization layers 304' and 314' built up an aluminum oxide passivation layer 315. To complete the pressure transducer structure 380, an oxide layer 317 is deposited over the inter-metal oxide layer 310 and the patterned metallization layer 314' to seal off the via hole 313 from the environment. Now that the via hole 313 is complete, the pressure transducer structure 380 may be used in conventional pressure transducer application by measuring the voltage between the patterned metallization layer 304' and the patterned metallization layer 314'.

As mentioned above, by measuring the change in capacitance between the patterned metallization layer 304' and the patterned metallization layer 314', it is possible to accurately ascertain the external pressure conditions. It should be noted that when the via hole 313 was formed, other tungsten plugs 312 were not removed when the wafer was submerged in the basic solvent 204 because other tungsten plugs 312 were completely covered by an overlying patterned metallization layer 314'. In one embodiment, the tungsten plugs that were not removed may have been interconnected to the negatively charged substrate 300, through an electrical contact to a gate or a diffusion region of a transistor.

Figure 4:
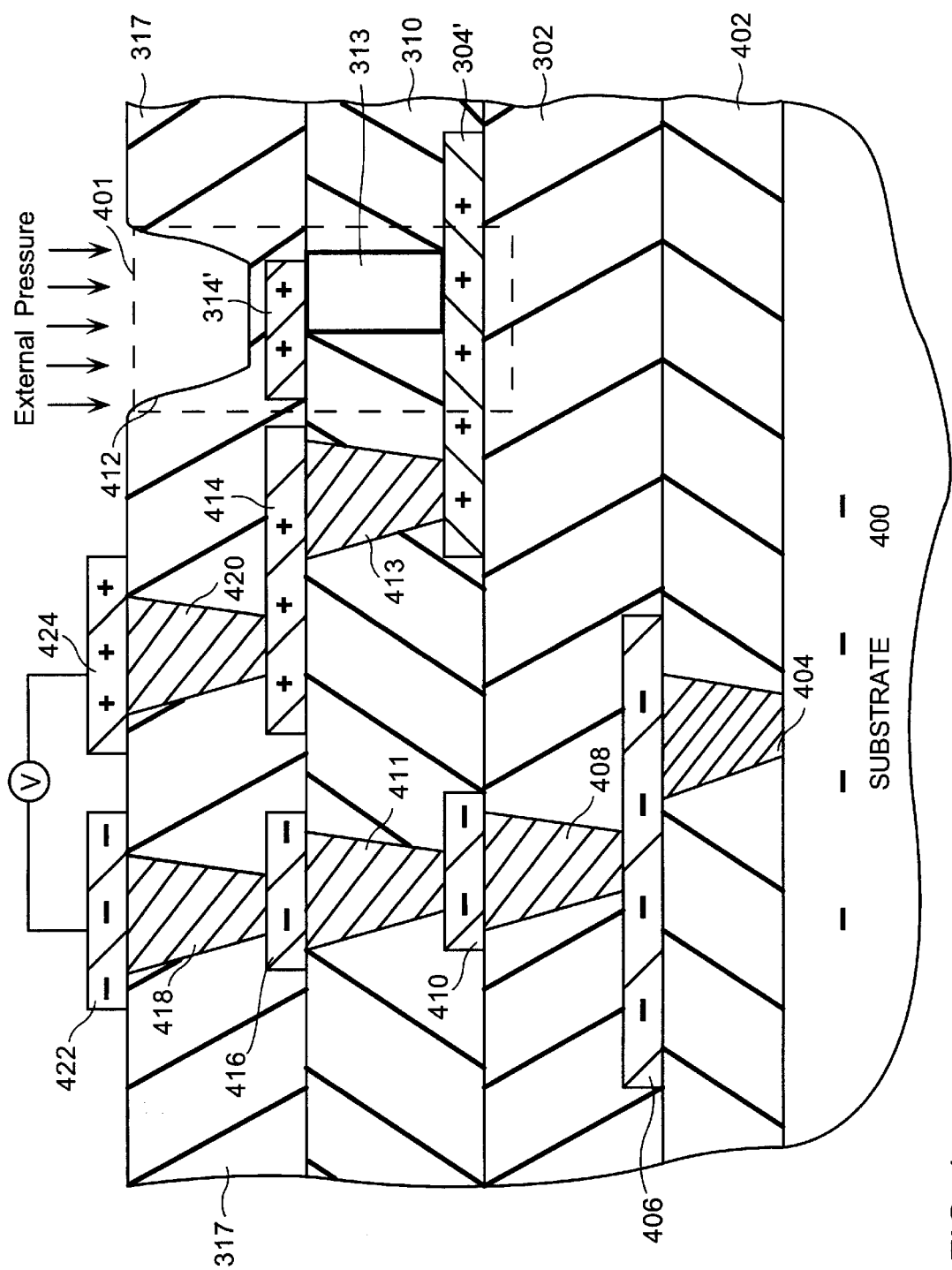
FIG. 4 is a cross-sectional view of a CMOS semiconductor device having an integrated pressure transducer structure in accordance with one embodiment of the present invention.

FIG. 4 is a cross-sectional view of a CMOS semiconductor device having an integrated pressure transducer structure 401 in accordance with one embodiment of the present invention. In this embodiment, when the pressure transducer 401 was fabricated, the tungsten plugs 404, 408, 411, and 413 were already formed in the respective inter-metal oxide layers 402, 302, and 310. However, it should be noted that the patterned metallization layer 314' and 304' were not electrically coupled to a negatively charged substrate 400. In fact, patterned metallization layers 406, 410, and 416 became negatively charged because they are interconnected to the substrate 400. Further, it is important to note that tungsten plug 413 is completely covered by the patterned metallization layer 414, and will therefore not be removed during the basic solvent submersion operation of FIG. 3E. The tungsten material that once was within the via hole 313 is now shown completely eroded to enable the formation of the pressure transducer 401.

Once these layers are complete, an inter-metal oxide layer 317 is deposited over the pressure transducer 401 and the patterned metallization layers 416, 414, and 314'. Next, tungsten plugs 416 and 420 are defined in the inter-metal oxide 317. Finally, patterned metallization layers 422 and 424 are coupled to tungsten plugs 416 and 420. Patterned metallization layers 422 and 424 are then used to measure the capacitance C between the patterned metallization layers 304' and 314'. If desired, the inter-metal oxide layer 317 may be etched to decrease the thickness of oxide over the pressure sensitive regions of the pressure transducer structure 401.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for making a semiconductor pressure transducer structure, comprising:

patterning a first metallization layer that lies over an first oxide layer to produce a first patterned metallization layer that is not in electrical contact with a substrate;

forming a tungsten plug in a second oxide layer that overlies the first patterned metallization layer, such that the tungsten plug is in electrical contact with the first patterned metallization layer;

patterning a second metallization layer that overlies the first patterned metallization layer and the tungsten plug to produce a second patterned metallization layer, and the patterning of the second metallization layer is configured to prevent the second patterned metallization layer from completely overlying the tungsten plug; and submerging the pressure transducer structure in a basic solution having a pH level that is greater than 7, such that the tungsten plug comes in direct contact with the basic solution that causes the tungsten plug to be removed while the pressure transducer structure is submerged in the basic solution.

2. A method for making a semiconductor pressure transducer structure as recited in claim 1, wherein the patterning of the first metallization layer and the second metallization layer causes each of the first patterned metallization layer and the second patterned metallization layer to be positively charged.

3. A method for making a semiconductor pressure transducer structure as recited in claim 2, wherein the patterning is performed in a plasma etching chamber that causes the substrate to be negatively charged, and the first patterned metallization layer and the second patterned metallization layer to be positively charged.

4. A method for making a semiconductor pressure transducer structure as recited in claim 3, wherein when the tungsten plug is caused to be removed, the tungsten plug reacts with the basic solvent to produce tungsten ions that flow away from the first and second patterned metallization layers that are positively charged.

5. A method for making a semiconductor pressure transducer structure as recited in claim 4, wherein the first patterned metallization layer is a floating structure.

6. A method for making a semiconductor pressure transducer structure as recited in claim 4, further comprising:

forming other tungsten plug structures in the second oxide layer, and patterning the second metallization layer to leave a patterned metallization layer that completely overlies the other tungsten plug structures in the second oxide layer.

7. A method for making a semiconductor pressure transducer structure as recited in claim 6, wherein the patterned metallization layer that completely overlies the other tungsten plug structures prevents the other tungsten plug structures from coming into contact with the basic solvent.

8. A method for making a semiconductor pressure transducer structure as recited in claim 7, wherein the first metallization layer and the second metallization layer is substantially all aluminum.

9. A method for making a semiconductor pressure transducer structure as recited in claim 1, further comprising:

integrating the pressure transducer structure and an integrated circuit on a semiconductor chip, the pressure transducer being configured to measure a pressure that is external to the semiconductor chip.

* * * * *